United States Patent [19]

Nakane et al.

[11] Patent Number: 5,218,297
[45] Date of Patent: Jun. 8, 1993

[54] SUPERCONDUCTIVE QUANTUM INTERFERENCE DEVICE IN HIGH TEMPERATURE ENVIRONMENTS HAVING REDUCED INDUCTANCE AND IMPROVED THERMAL NOISE RESPONSE

[75] Inventors: Hideaki Nakane, Hachioji; Yoshinobu Tarutani, Yamanashi, both of Japan

[73] Assignee: Hitachi, Ltd., Tokyo, Japan
[21] Appl. No.: 884,473
[22] Filed: May 13, 1992

Related U.S. Application Data

[63] Continuation of Ser. No. 703,043, May 17, 1991, abandoned, which is a continuation of Ser. No. 305,374, Feb. 1, 1989, abandoned.

[30] Foreign Application Priority Data

Feb. 5, 1988 [JP] Japan .................. 63-23669

[51] Int. Cl.⁵ .......................................... G01R 33/035
[52] U.S. Cl. .................................. 324/248; 505/702; 505/846
[58] Field of Search ............... 324/248, 244; 505/701, 505/702, 705, 704, 883, 845, 846

[56] References Cited

U.S. PATENT DOCUMENTS

| | | |
|---|---|---|
| 3,528,005 | 9/1970 | Morse et al. .................. 324/248 |
| 4,064,029 | 12/1977 | Wu et al. ...................... 324/248 X |
| 4,224,630 | 9/1980 | Kroger .......................... 324/248 X |
| 4,588,947 | 5/1986 | Ketchen ........................ 324/248 X |
| 4,801,882 | 1/1989 | Daalmans ...................... 324/248 |
| 4,804,915 | 2/1989 | Hoenig .......................... 324/248 |

FOREIGN PATENT DOCUMENTS

| | | | |
|---|---|---|---|
| 0246419 | 3/1987 | European Pat. Off. | |
| 0224677 | 7/1985 | Fed. Rep. of Germany | 324/248 |
| 61-88576 | 5/1986 | Japan . | |
| 61-196587 | 8/1986 | Japan . | |
| 62-240878 | 10/1987 | Japan | 324/248 |
| 63-25574 | 3/1988 | Japan . | |
| 63-095367 | 4/1988 | Japan | 324/248 |
| 1-06779 | 1/1989 | Japan | 324/248 |

OTHER PUBLICATIONS

Wu et al., "Superconductivity at 93 K in a New Mixed-Phase Y-Ba-Cu-O Compound System at Ambient Pressure", *Physical Review Letters*, vol. 58, No. 9, Mar. 2, 1987, pp. 908-910.

Fisher et al., "Superconductor Research Pace Quickens", *Ceramic Bulletin*, vol. 66, No. 7, 1987, pp. 1087-1092.

Kaneto et al., "The Application of Superconducting Ceramics . . . ", *Journal of Applied Physics*, vol. 26, No. 11, Nov., 1987, pp. L1842-L1844.

Robbes et al., "Dispositif magnétométrique supraconducteur á sonde céramique YBaCuO", *C. R. Acad. Sci. Paris*, t. 306, Serie 11, 1988, pp. 121-124.

Rabinowitz, "Superconductivity and Electric Power", *Forum for Applied Research and Public Policy*, Spring 1988, pp. 55-62.

Rollins et al., "Magnetic field profiles in type-II superconductors with pinning using a new ac technique", *Journal of Applied Physics*, vol. 45, No. 12, Dec. 1974, pp. 5392-5398.

IEEE Transactions on Magnetics, vol. Mag-23 No. 2 Mar. 1987 pp. 1650-1657, IEEE, NY, US: M. B. Ketchen "Integrated thin-film dc squid sensors".

R. H. Koch, C. P. Umbach, G. J. Clark, P. Chaudhari, R. B. Laibowitz Quantum Interference Devices Made From Superconducting Oxide Thin Films May 22, 1987; pp. 200-202.

Primary Examiner—Gerard R. Strecker
Assistant Examiner—Warren S. Edmonds
Attorney, Agent, or Firm—Kenyon & Kenyon

[57] ABSTRACT

Since a superconducting quantum interference device (SQUID) using a high temperature superconductor operates at the liquid nitrogen temperature 77 K, which is higher than the liquid helium temperature 4.2 K, it is necessary that the value of signal voltages is at a level, which is sufficiently higher than the thermal noise level. The superconducting inductance L should be decreased with increasing current flowing through Josephson junctions in the SQUID. The superconducting inductance can be reduced by various methods such as reduction in the size of the aperture of the superconducting inductance, parallel connection of superconducting inductances, utilization of a superconducting ground plane, etc., in order to realize a SQUID, which can be use in a wide application field at the liquid nitrogen temperature 77 K.

17 Claims, 10 Drawing Sheets

SUPERCONDUCTIVE QUANTUM INTERFERENCE DEVICE IN HIGH TEMPERATURE ENVIRONMENTS HAVING REDUCED INDUCTANCE AND IMPROVED THERMAL NOISE RESPONSE

This application is a continuation of application Ser. No. 07/703,043 filed on May 17, 1991, now abandoned which is a continuation of Ser. No. 07/305,374, Feb. 1, 1989, now abandoned.

BACKGROUND OF THE INVENTION

The present invention relates to a superconducting quantum interference device (hereinbelow abbreviated to SQUID) suitable for detecting very weak magnctic flux, and in particular to a SQUID utilizing high temperature superconductor.

The SQUID is a magnetic fluxmeter having the highest sensitivity, utilizing the quantum interference effect, which electrons in the superconductive state have. For this reason, SQUIDs are used as devices for measuring very weak magnetic field, e.g. for measurement of magnetic field in a living body, measurement of terrestrial magnetism, search of underground resources, etc.

The SQUID has an excellent performance as a fluxmeter. However, since the operating temperature of a Josephson element is restricted by the critical temperature of the superconductor, the SQUID using a prior art superconductor made of metal such as Nb, etc. was used at the liquid helium temperature (boiling point: absolute temperature 4.2 K). However, since liquid helium is expensive and further because of problems concerning cryogenic techniques, there existed restrictions in its application field. Recently, owing to the discovery and development of oxide high temperature superconductors the application of the SQUID has entered a new stage. Attention has been paid to SQUIDs using liquid nitrogen (boiling point: absolute temperature 77 K) which is cheap and used widely as cooling medium, which has been realized by using an oxide high temperature superconductor. However, since the operating temperature of the SQUID using an oxide high temperature superconductor is 77 K, which is about 20 times as high as the operating temperature of the prior art SQUID, which is 4.2 K, there exist technical problems, which are to be solved.

A SQUID using a high temperature superconductor thin film is disclosed in an article published in APPl. Phys. Lett., 51, (1987) pp 200-202. Although some examples on the SQUID using a high temperature superconductor thin film have been published, it has been not yet realized to study technical problems for the purpose of practical use and to find solutions therefor.

SUMMARY OF THE INVENTION

The object of the present invention is to provide a SQUID using a high temperature superconductor.

Among the technical problems to be solved for realizing a SQUID using a high temperature superconductor thin film there is a problem concerning thermal noise. Concerning thermal noise, following equations are valid:

$$\text{thermal noise voltage } \sqrt{|V_N|^2} = 2 k_B TRB \quad (1)$$

$$\text{thermal noise current } \sqrt{|I_N|^2} = 2 k_B T g B \quad (2)$$

where
$k_B$: Boltzmann's constant,
T: absolute temperature (K),
R: resistance,
B: frequency band width of a relevant signal, and
$g = 1/R$: conductance.

As it can be understood from Eqs. (1) and (2), the thermal noise varies with respect to the temperature. Consequently it is increased necessarily by the fact that the operating temperature of the SQUID changes from the liquid helium temperature (4.2 K) to the liquid nitrogen temperature (77 K). That is, it gives rise to a problem concerning thermal noise produced in a resistor to use a high temperature superconductor in the SQUID. This thermal noise hides voltage signals in the SQUID and at the same time decreases the critical current for the superconductor, which reduces further the voltage signals. For this reason, it is necessary to set the signal level in the SQUID in such a manner that the thermal noise produced in the resistor doesn't obstruct measurements. The object of the present invention is to study the structure of the SQUID and the thermal noise produced in the resistor and to set signal values to such a level that the thermal noise gives rise to problems in order to provide a SQUID using a high temperature superconductor, which is usable in practice.

In a SQUID using a high temperature superconductor, since it is used at the liquid nitrogen temperature (77 K) contrarily to the fact that a prior art SQUID is used at the liquid helium temperature (4.2 K), thermal noise increases, as described previously. Together therewith, it becomes necessary to set signal detection voltage values at a level higher than that of the thermal noise. For this reason it is necessary to increase the intensity $I_c$ of the current flowing through a Josephson junction in the SQUID. By the prior art SQUID operating at the liquid helium temperature 4.2 K, even with a critical current $I_m$ flowing through the Josephson junction, which is as low as about 10 $\mu$A, it is possible to detect signal voltages overcoming voltages due to the thermal noise. However, when the SQUID using a high temperature superconductor operates at the liquid nitrogen temperature 77 K, in order to be able to detect signal voltages, overcoming the thermal noise, it is necessary to increase the critical current $I_m$ flowing through the Josephson junction to about 100 $\mu$A, which is 10 times as high as that required for the preceding case.

On the other hand, among the inductance L of the SQUID, the critical current $I_m$ flowing through the Josephson junction, and the fluxoid quantum $\phi_o$, the following relation is valid:

$$LI_m \approx \phi_0 = h/2e = 2.07 \times 10^{-15} (Wb) \quad (3)$$

Consequently, when the critical current $I_m$ flowing through the Josephson junction is increased, it is necessary to reduce the inductance L of the SQUID. Concretely speaking, supposing that the SQUID inductance, with which a desired output current can be obtained with respect to the thermal noise, when the SQUID operates at the liquid helium temperature 4.2 K, is 100–400 pH, the SQUID inductance, with which a desired output current can be obtained with respect to the thermal noise, when it operates at the liquid nitrogen temperature 77 K, is 10–40 pH, which is one tenth of the preceding value.

Figure 12:
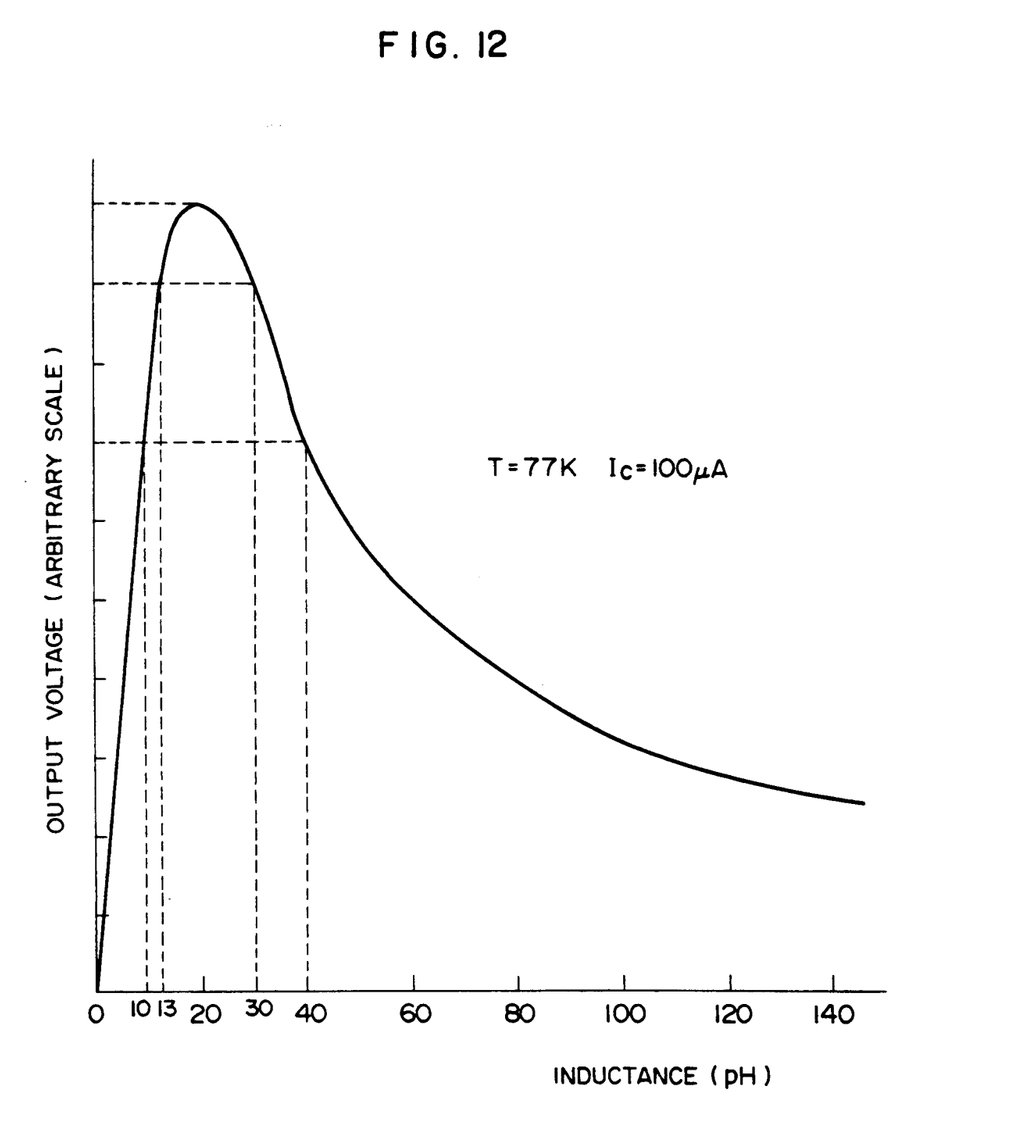
FIG. 12 is a graph indicating the relation between the SQUID inductance and the output voltage at T = 77 K (current flowing through a Josephson junction $I_c = 100$ μA).

FIG. 12 indicates the relation between the SQUID inductance and the output voltage, when the current flowing through a Josephson junction $I_c = 100$ μA, the SQUID operating at 77 K.

The present invention, based on the consideration described above, is characterized in that the SQUID inductance is chosen so as to be in a range between 10 and 40 pH, and more preferably in a range between 13 and 30 pH, as indicated in FIG. 12.

As concrete methods for reducing the SQUID, following measures are taken in the embodiments, which constitute the content of the present invention;

(1) the aperture of the SQUID is reduced;
(2) inductances of a plurality of SQUIDs are connected in parallel;
(3) a superconductive ground plane is used; etc. Now a concrete structure of a SQUID according to the present invention will be explained.

In a SQUID using a high temperature superconductor it is possible to set the signal voltage of the SQUID at a level higher than that of the thermal noise voltage and to make the SQUID operate with a high efficiency at the liquid nitrogen temperature by reducing the inductance of the SQUID by the methods (1) to (3) described above.

According to the present invention, it is possible to realize the optimum structure for making a SQUID using a high temperature superconductor operate at the temperature of liquid nitrogen of low price and practical use of the SQUID using a high temperature superconductor in a wide application field.

DETAILED DESCRIPTION OF THE PRESENT INVENTION

Hereinbelow the preferred embodiments of the present invention will be explained, referring to the drawings.

Figure 1A:
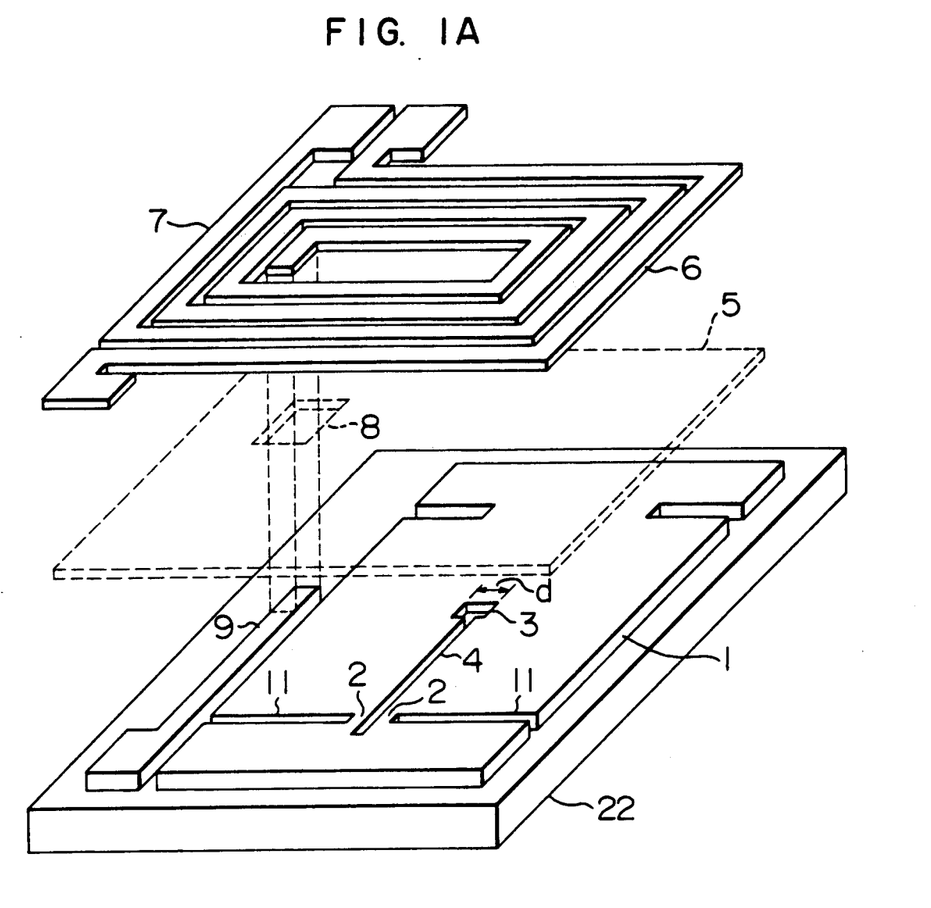
FIG. 1A is a scheme illustrating a SQUID in an embodiment of the present invention.

FIG. 1A is a scheme illustrating an example of an embodiment of the present invention.

In the SQUID indicated in FIG. 1A a washer-shaped inductance is used as a SQUID inductance. In the washer-shaped coil, since an aperture portion, in which the magnetic flux is coupled, and the Josephson junction can be separated far from each other, the inductance due to the deep cut off in the Josephson junction can be removed from the SQUID inductance.

In the SQUID indicated in FIG. 1A a first high temperature superconductor layer 1 is formed on a substrate 22. Then an aperture portion 3 and a slit 4, where the magnetic flux is coupled, which constitute the SQUID inductance, are formed by processing the first high temperature superconductor layer 1. Further there are disposed deeply cut off portions 11 on both the sides of the slit 4 at the end portion thereof to form Josephson junctions 2. Since microbridge type Josephson junctions are used often in connection with the coherence length of the crystalline grain boundary in the high temperature superconductor, the present invention will be explained below, taking the microbridge type junction, as an example.

Figure 1B:
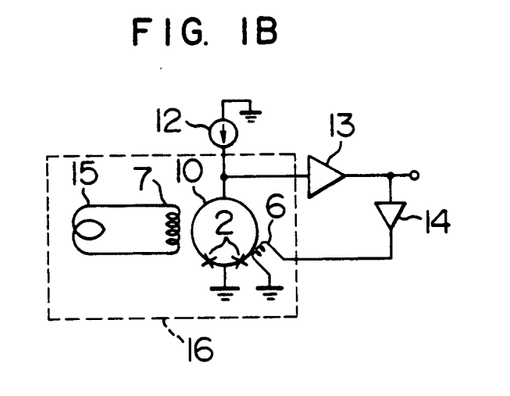
FIG. 1B is a circuit diagram of the SQUID in the embodiment of the present invention.
Figure 1C:
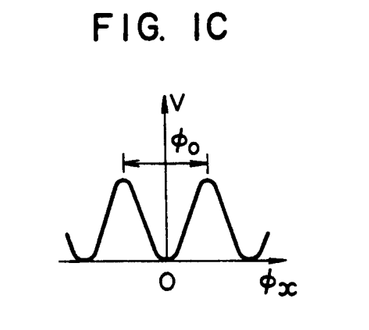
FIG. 1C is a scheme for explaining a periodic voltage generated in the SQUID in the embodiment of the present invention.

A first interlayer insulating layer 5 is formed on this first superconductor layer 1. Further a modulation coil 6 and an input coil 7 are formed by processing a second high temperature superconductor layer thereon. One end of the input coil 7 is taken out by a lower connection electrode 9 through a contact hole formed in the first interlayer insulating layer 5. FIG. 1B shows an example of the circuit, in the case where the SQUID is operated as a fluxmeter. A constant current power supply 12, a sensor coil 15 and a phase detector amplifier 13 are connected with the SQUID 10. FIG. 1C shows a periodic voltage generated, when the SQUID 10 is biased with a constant current and a magnetic flux is applied thereto. Since the period of this voltage is a very small value corresponding to the fluxoid quantum $\phi_0$ ($2.07 \times 10^{-15}$ Wb), a high sensitivity magnetic field measurement is made possible by means of a SQUID. In the circuit indicated in FIG. 1B variations in voltage with respect to variations in magnetic flux are detected by the phase detector amplifier 13 and fed back to the modulation coil 6 in the SQUID 10 through a feedback circuit 14. In this way, the operating point of the SQUID 10 being fixed, it is possible to read out electrically variations therefrom as variations in the fed back signal. By means of this circuit it is possible to detect one thousandth to one ten thousandth of the fluxoid quantum $\phi_0$. The SQUID 10 and the sensor coil are located in a low temperature section 16. The high temperature superconductor is made of a mixture of some of oxides of potassium K, calcium Ca, cesium Cs, scandium Sc, strontium Sr, yttrium Y, rare earth elements, barium Ba, copper Cu, thallium Tl, lead Pb, and bismuth Bi. For example, $YBa_2Cu_3O_{7-x}$ for which $T_c=90$ K, $Bi_aSr_bCa_cCu_cO_x$ for which $T_c=100$ K, $Tl_aSr_bCa_c\text{-}Cu_dO_x$ for which $T_c=120$ K, etc. are used therefor. Since this SQUID fluxmeter utilizes a high temperature superconductor, it can be used at the neighborhood of the liquid nitrogen temperature 77 K. An insulating substrate is used as th substrate 22. As the concrete material therefor magnesium oxide MgO, strontium titanate $SrTiO_3$, etc. are used. It is tried also to use Si or $SiO_2$ for the substrate 22.

As explained in the item of "Summary of the Invention" section, in the case where a SQUID using a high temperature superconductor is operated at the liquid nitrogen temperature, the SQUID inductance should be chosen in a range between 10 and 40 pH and more preferably between 13 and 30 pH. In the case where the aperture 3 of the SQUID is quadratic, between the length of the side and the SQUID inductance the following relationship is valid;

$$L = 1.25 \mu_0 d \quad (4)$$

where d represents the length of one side of the aperture. In the SQUID having the structure indicated in FIG. 1A, in order to realize the SQUID inductance described above, the length d of one side of the aperture should be chosen in a range between 6.4 and 25.5 $\mu$m and more preferably between 8.3 and 19.1 $\mu$m. Although explanation has been made for the case where the aperture is quadratic, the size thereof can be determined for other shapes by a method similar thereto. For example, for a circular aperture, the size thereof can be determined by a relationship $L = \mu_0 D$ (D representing the diameter of the aperture).

Furthermore, in this embodiment, the SQUID is constructed by superposing the first high temperature superconductor layer and the second high temperature superconductor layer (forming the modulation coil, etc.) on each other in the form of a double layer as the high temperature superconductor layer. In this embodiment the connection electrode 9 and the first high temperature superconductor layer 1 for the SQUID are located on the same plane so that a SQUID element having the simplest structure is realized. In the SQUID in the embodiment indicated in FIG. 1A the superconductor layer 1 is about 1 $\mu$m thick; the interlayer insulating layer 5 is about 1.2 $\mu$m thick; and the modulation coil is about 1.4 $\mu$m thick. By reason of the fabrication method, among the first superconductor layer 1, the interlayer insulating layer 5 and the modulation coil 6 obtained by processing the second superconductor layer, a higher superposed layer is somewhat thicker than a lower layer.

Figure 2:
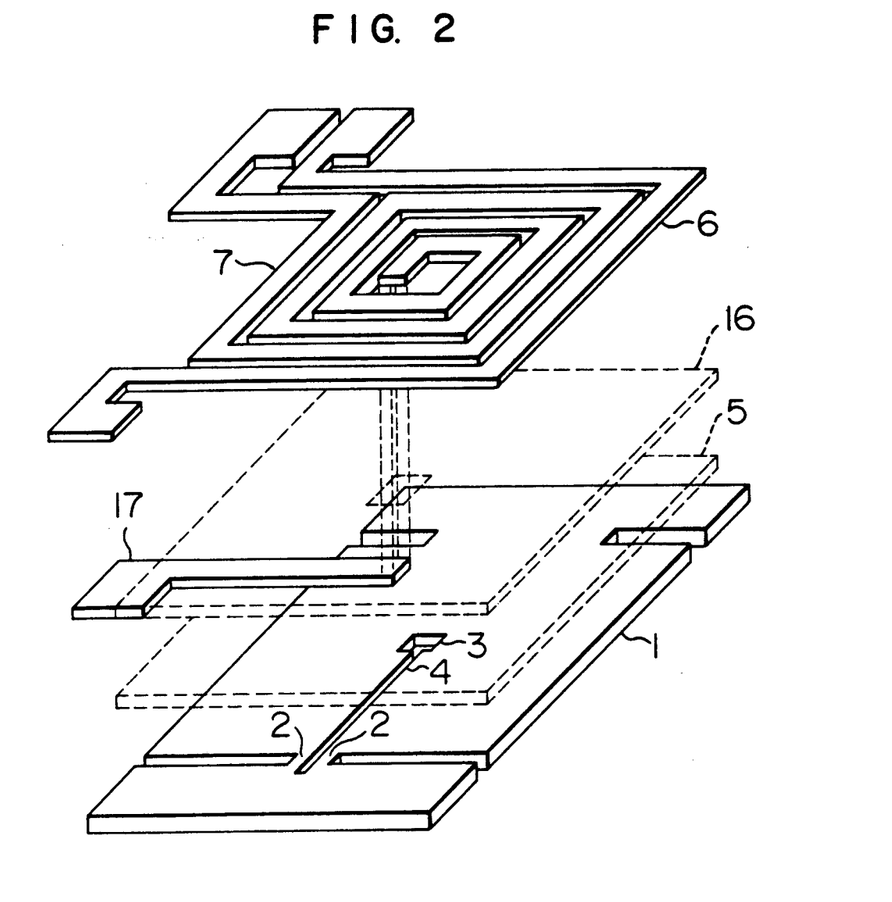
FIG. 2 is a scheme illustrating a SQUID in another embodiment of the present invention.

FIG. 2 is a scheme of an embodiment, in which the SQUID comprises 3 high temperature superconductor layers. An aperture portion 3 and a slit 4 are formed by processing a first high temperature superconductor layer 1, which constitute a SQUID inductance. Further two Josephson junctions 2 are disposed. An interlayer insulating layer 5 is formed thereon and further a connection electrode 17 and an interlayer insulating layer 16 are superposed thereon. Finally a modulation coil 6 and an input coil 7 are formed to construct the SQUID. In such a structure a constant bias current is made to flow through the SQUID inductance, which is the first layer; a small signal is applied to the input coil 7, which is a combination of the second and third layers; further a feedback signal is applied to the modulation coil 6; and thus a very weak magnetic flux is detected. In this embodiment, since the whole input coil 7 is superposed on the SQUID inductance, an effect can be obtained that the coupling coefficient between the input coil 7 and the SQUID inductance is great.

Figure 3:
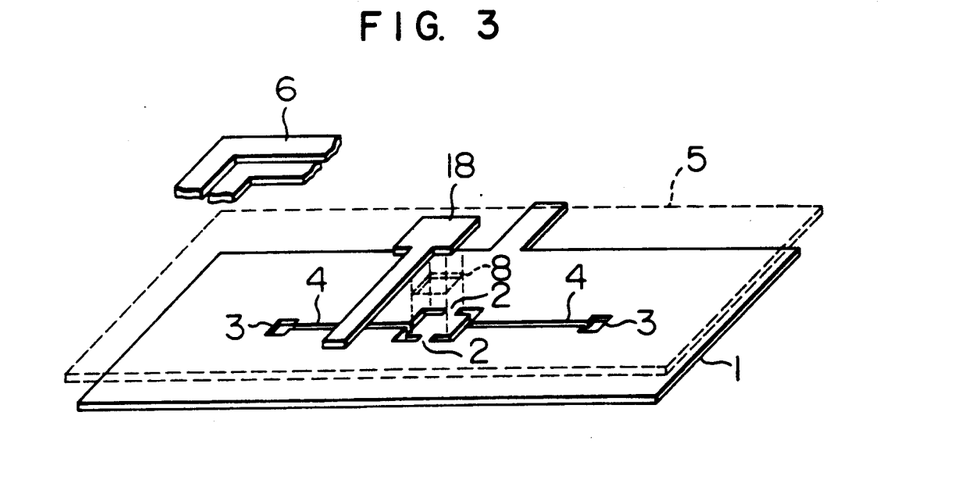
FIG. 3 is a scheme illustrating a SQUID, in which SQUID inductances are connected in parallel, in still another embodiment of the present invention.
Figure 4:
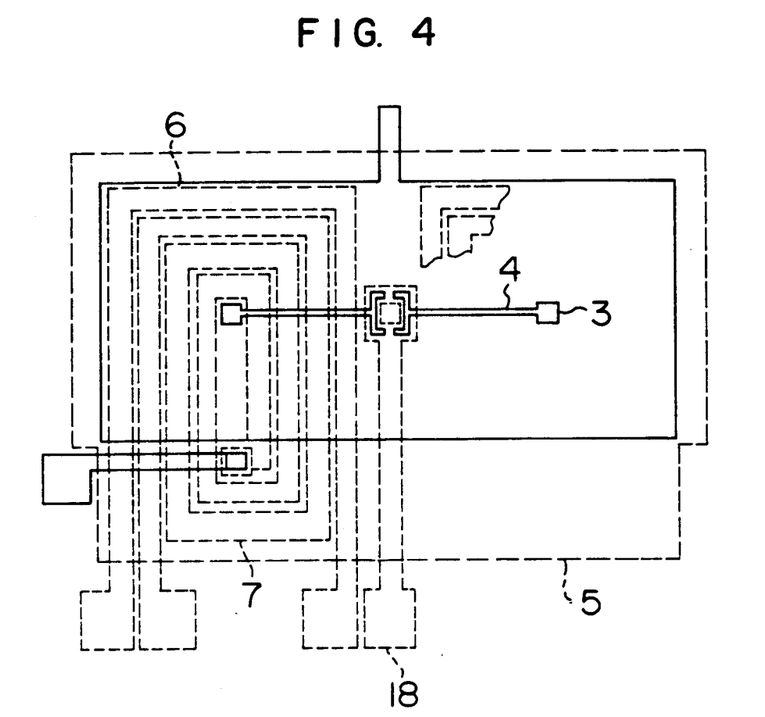
FIG. 4 is a plan view of the SQUID indicated in FIG. 3.

FIGS. 3 and 4 are a scheme and a plan view illustrating an embodiment in which a SQUID is constructed by using 2 high temperature superconductor layers. They show the structure of lower layers, removing a part of the input coil 7 and the modulation coil 6. Two sets of apertures 3 and slits 4 are formed by processing the high temperature superconductor layer 1. Two Josephson junctions 2 are formed at the central portion and a connection electrode 18 is connected through a contact hole 8 after having insulated them by means of an interlayer insulating layer 5. In this way two of the SQUID inductances used in FIGS. 1 and 2 are connected in parallel and thus the inductance is reduced to a half. For this reason, even if there is current flowing through the Josephson junctions, it can be set in the optimum operating range $(L \cdot I_m \sim \phi_0)$ for the SQUID and thus an effect that the output voltage is high can be obtained. Further, if $I_m$ can be great at the high temperature operation, another effect can be obtained that erroneous operation due to thermal noise is prevented. Further, since the coupling portion of the input coil 6 is doubled, there is still another effect that the coupling, when an input signal is applied to the SQUID, is great. In this way it is possible to reduce the superconducting inductance by the parallel connection, while keeping the aperture portion larger than that of the single connection.

Figure 5:
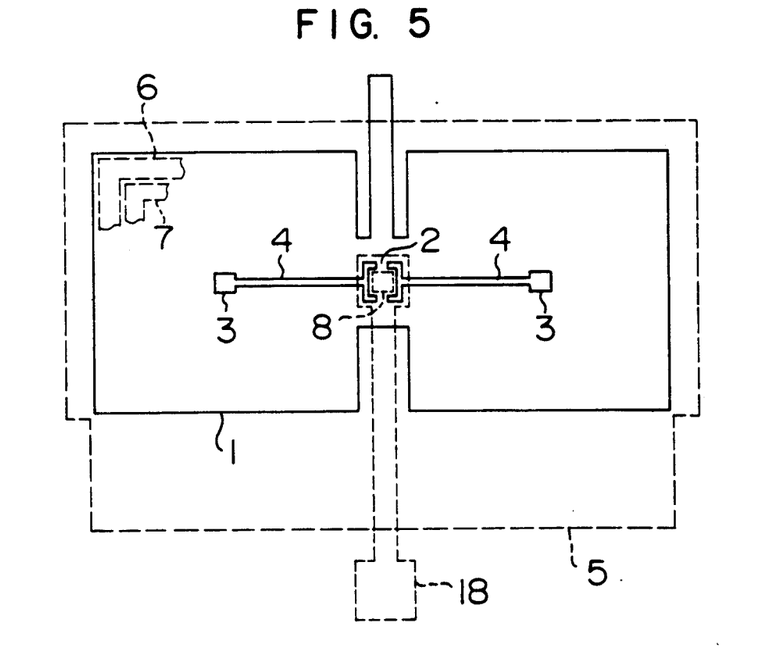
FIG. 5 is a plan view of the SQUID, in which SQUID inductances are connected in parallel, in still another embodiment.

FIG. 5 is a plan view of an embodiment in which a SQUID is constructed by using two high temperature superconductor layers. Two sets of apertures 3 and slits 4 are formed by processing the high temperature superconductor layer 1. Two Josephson elements are formed at the central portion and a connection electrode 18 is connected through a contact hole 8 after having insulated them by means of an interlayer insulating layer 5. In this embodiment, since the electrode in the neighborhood of the connection electrode 18 is small, an effect is that the stray capacitance is small. Further, in the embodiments illustrated in FIGS. 3 and 5, two SQUID inductances are connected in parallel. However, even if more than two inductances are connected in parallel, a similar effect can be obtained. Further, even if a three-layered superconductor layer is used, as indicated in FIG. 2, a similar effect can be obtained.

Figure 6A:
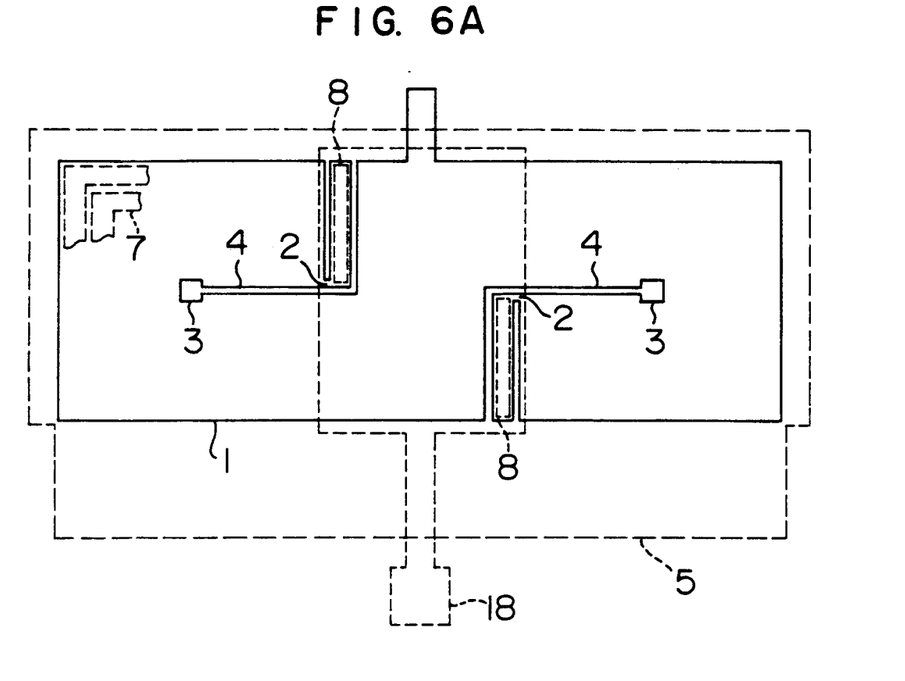
FIG. 6A is a plan view of an S-shaped SQUID in still another embodiment of the present invention.
Figure 6B:
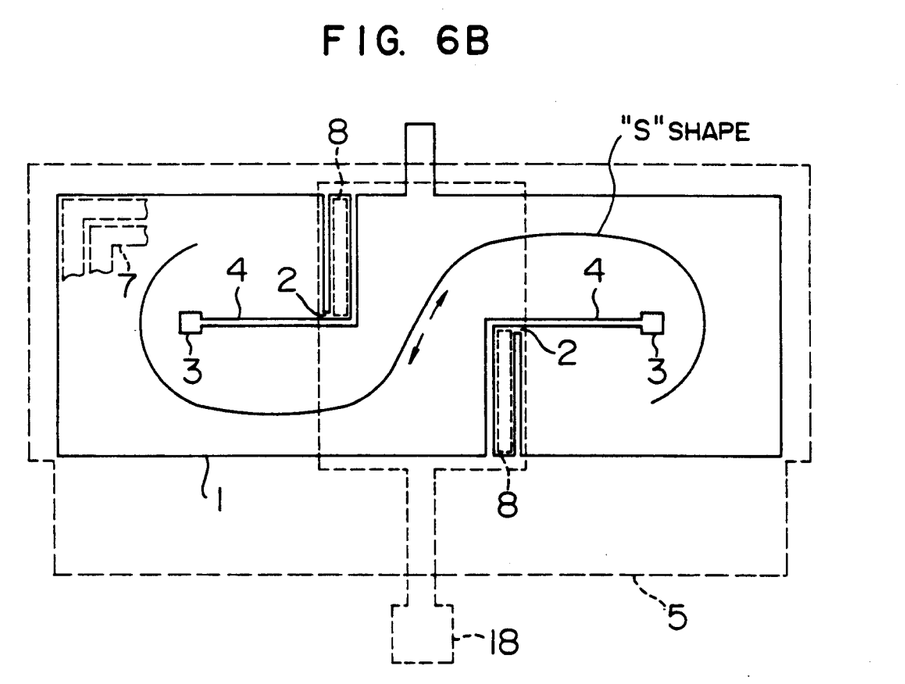
FIG. 6B is a scheme for explaining the SQUID indicated in FIG. 6B.

FIG. 6A is a plan, view of an embodiment in which a SQUID is constructed by using two high temperature superconductor layers. Two sets of apertures 3 and slits 4 are formed by processing the high temperature superconductor layer 1. A Josephson junction 2 is formed at the extremity portion of each of the slits 4 and a connection electrode 18 is connected through contact holes 8 after having insulated them by means of an interlayer insulating layer 5. Although the inductance is reduced to a half in this embodiment, too, by connecting SQUID inductances in parallel, the difference thereof from the embodiment indicated in FIGS. 4 and 5 consists in that the slits 4 are formed in an L-shape and that the superconductor layer 1 is S-shaped, as indicated in FIG. 6B. Since the superconductor layer 1 is S-shaped, the currents at the places where the magnetic flux is coupled with the two right and left SQUID inductances are compensated, as indicated by arrows. In this way an effect can be obtained that it is possible to nullify magnetic flux noise coming from the exterior. In this case, the input coils 7 are directed opposite to each other so that the signals from the input coils are not compensated. In this embodiment, too, the SQUID inductance can be reduced and an effect that the optimum operating range can be set is obtained.

Figure 7:
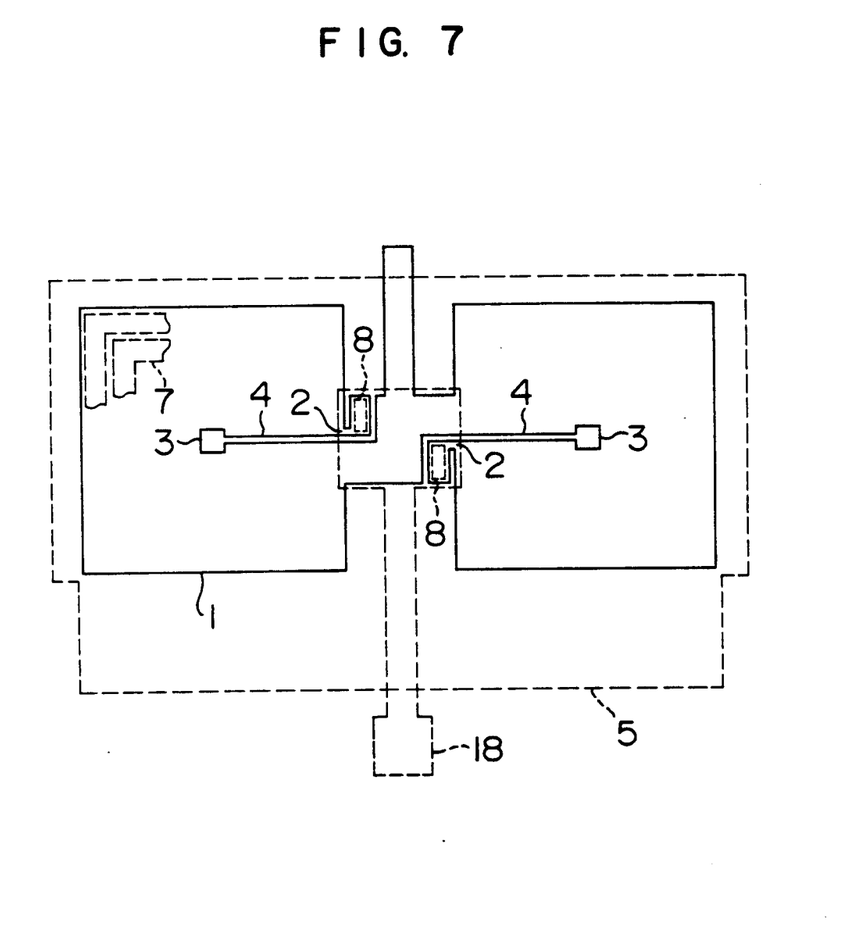
FIG. 7 is a plan view of a SQUID, in which SQUID inductances are connected in parallel, in still another embodiment of the present invention.

FIG. 7 is a plan view of an embodiment in which a SQUID is constructed by using a two high temperature superconductor layers. Two sets of apertures 3 and slits 4 are formed by processing the high temperature superconductor layer 1 and 2 SQUID inductances are connected in parallel so that the value of the inductance is reduced to a half and the optimum operating range is set. Further the left and right SQUID inductances are directed opposite to each other so that the magnetic flux noises coupled therewith are compensated. In this way, apart from the effects that the optimum operating range can be set and that the magnetic flux noises are compensated, the stray capacitance is reduced by making the electrode at the neighborhood of the connection electrode 18 smaller.

Figure 8:
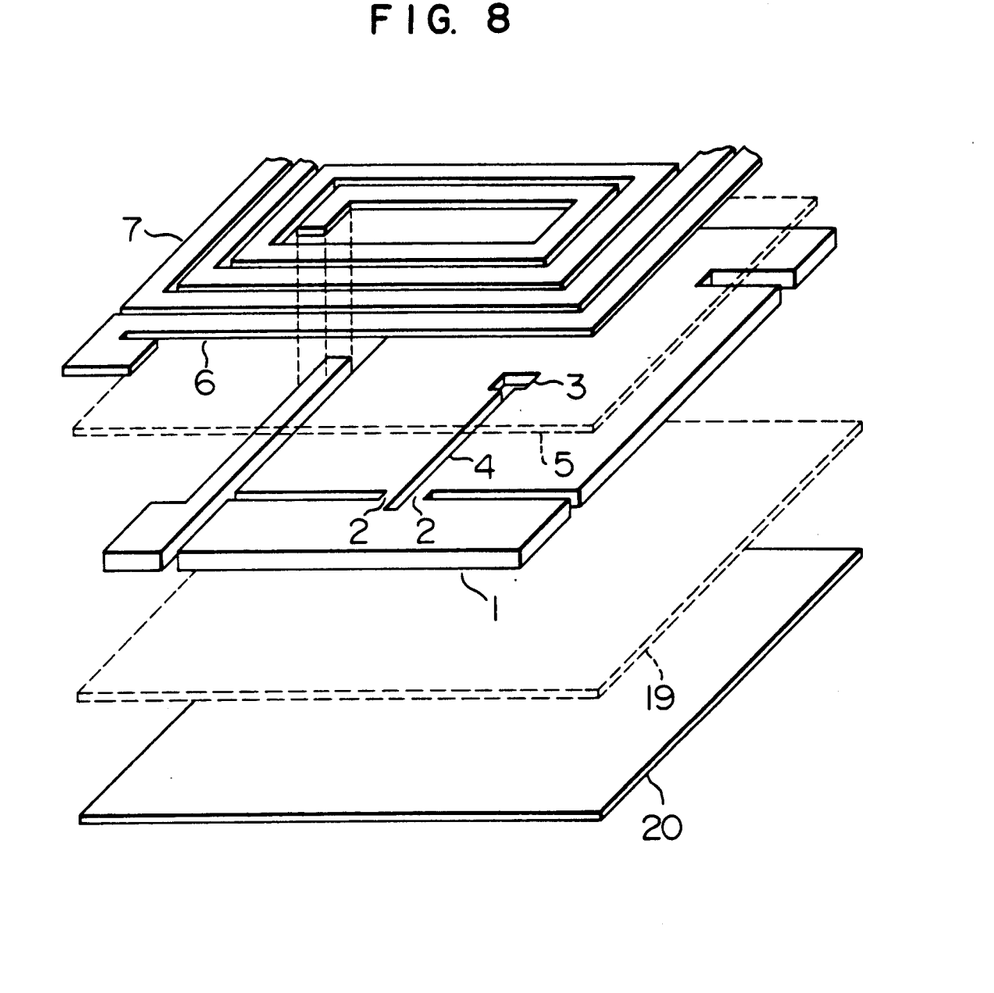
FIG. 8 is a scheme illustrating a SQUID, in which a superconducting ground plane is used, in still another embodiment of the present embodiment.

FIG. 8 is a scheme illustrating still another embodiment in which a SQUID is constructed by using three high temperature superconductor layers. A high temperature superconductor layer serves as a superconducting ground plane. After having insulated it by means of an interlayer insulating layer 19, an aperture portion 3 and a slit 4 are formed by processing another high temperature layer 1, which constitute a SQUID inductance and two Josephson junctions 2 are disposed. After having formed an interlayer insulating layer 5 thereon to insulate them, an input coil 7 and a modulation coil 6 are formed to constitute the SQUID. In this embodiment, since the SQUID inductance is superposed on the superconducting ground plane, the inductance is reduced and the optimum operating range of the SQUID can be realized.

Figure 9:
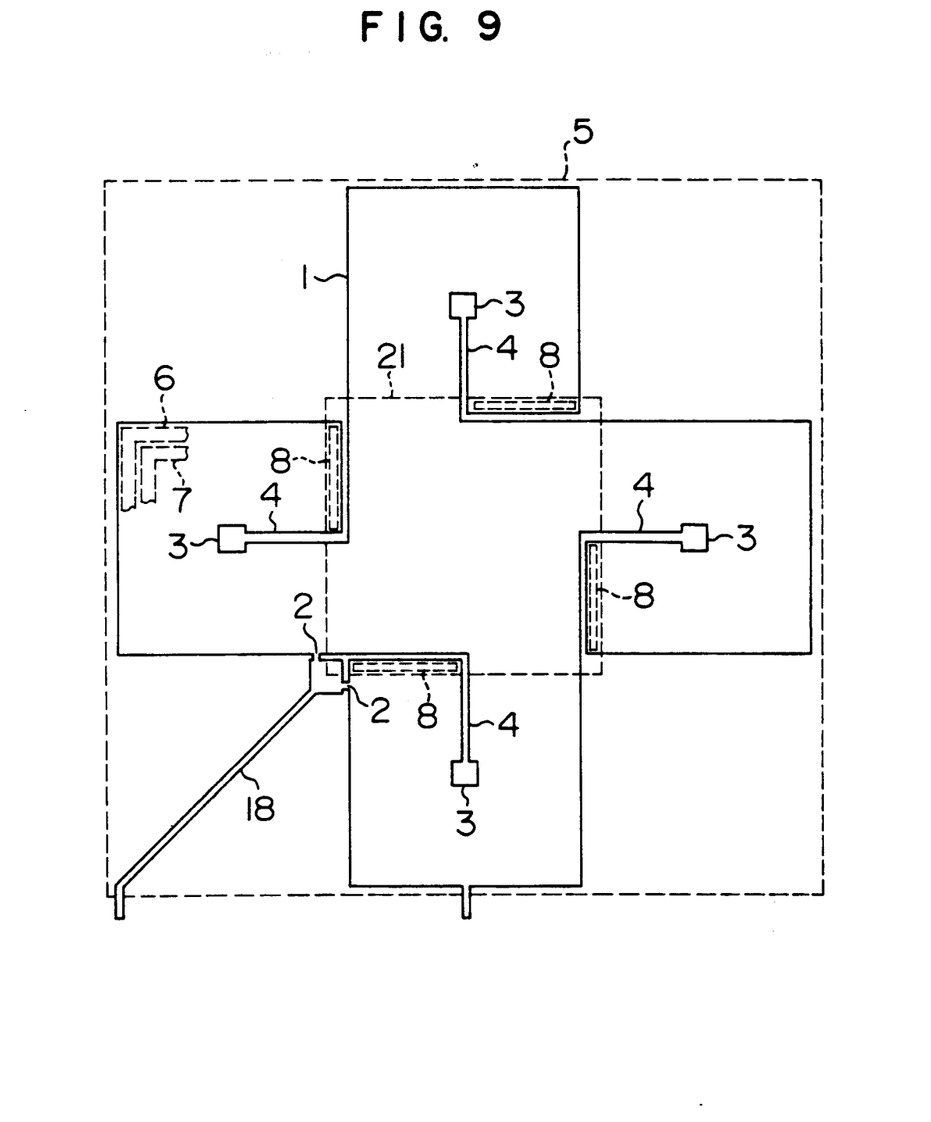
FIG. 9 is a plan view of a SQUID, in which 4 SQUID inductances are connected in parallel, in still another embodiment of the present invention.

FIG. 9 is a plan view of a still another embodiment in which a SQUID is constructed by using two high temperature superconductor layers. Four sets of aperture portions 3 and slits 4 are formed by processing the high temperature superconductor layer 1 and 4 SQUID inductances are connected in parallel so that the value of the inductance is reduced to a quarter and the SQUID is set in the optimum operating range. Further these SQUID inductances are directed differently so that magnetic flux noises coupled therewith are compensated. In this way the optimum operating range can be set and the output voltage is high. In addition, there is another effect that the SQUID thus constructed is hardly influenced by external magnetic flux noise.

Figure 10:
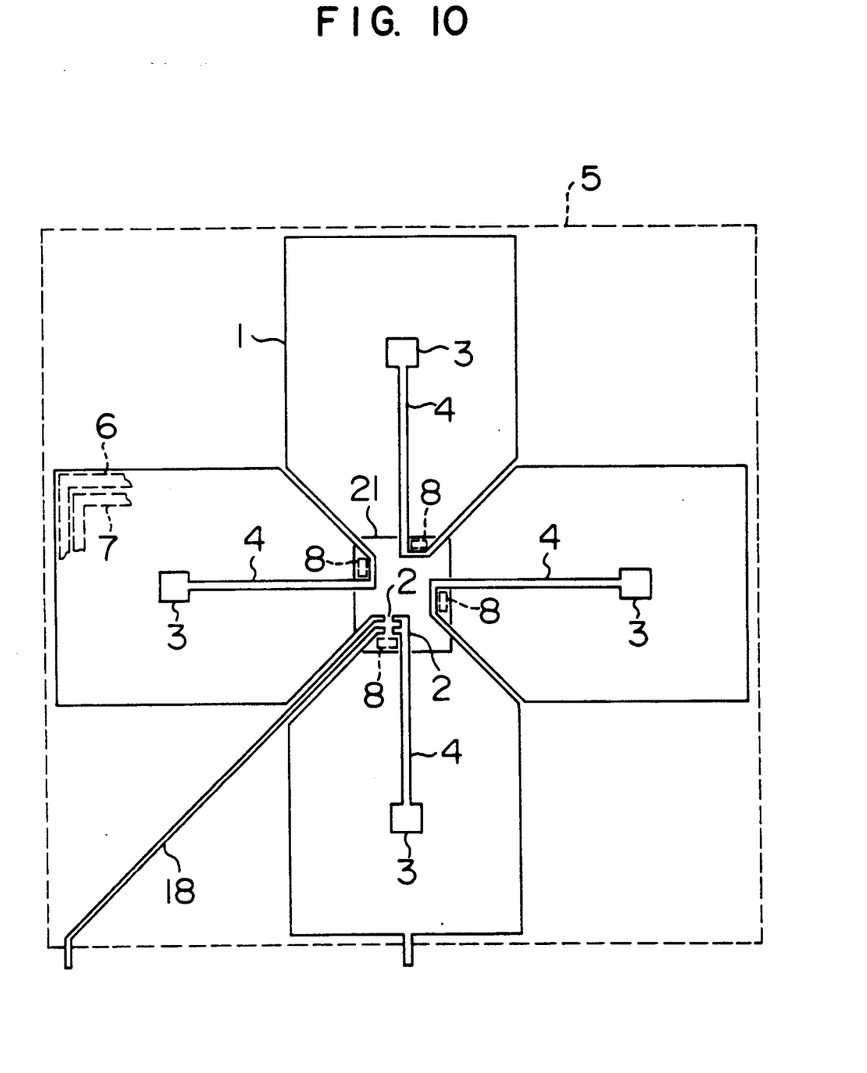
FIG. 10 is a scheme illustrating a SQUID, in which 4 SQUID inductances are connected in parallel, in still another embodiment of the present invention.

FIG. 10 is a plan view of still another embodiment in which a SQUID is constructed by using two high temperature superconductor layers. Four sets of aperture portions 3 and slits 4 by processing the high temperature superconductor layers 1 and 4 SQUID inductances are connected in parallel so that the value of the inductance is reduced to a quarter and the SQUID is set in the optimum operating range. Further these SQUID inductances are so combined that magnetic flux noises coupled therewith are compensated. Further the area of the connection electrode 21, which is in the second layer, is made small to reduce stray capacitance. In this way an effect is obtained that the inductance is reduced and the SQUID can be set in the optimum operating range so that a high output voltage is obtained and there is another effect that the S/N ratio can be improved, because magnetic flux noises are compensated. Furthermore, since the stray capacitance is reduced, there is still another effect that the operating frequency band is enlarged or the output voltage is increased. Equivalent effects can be expected, if more than two inductances are connected in parallel.

Figure 11:
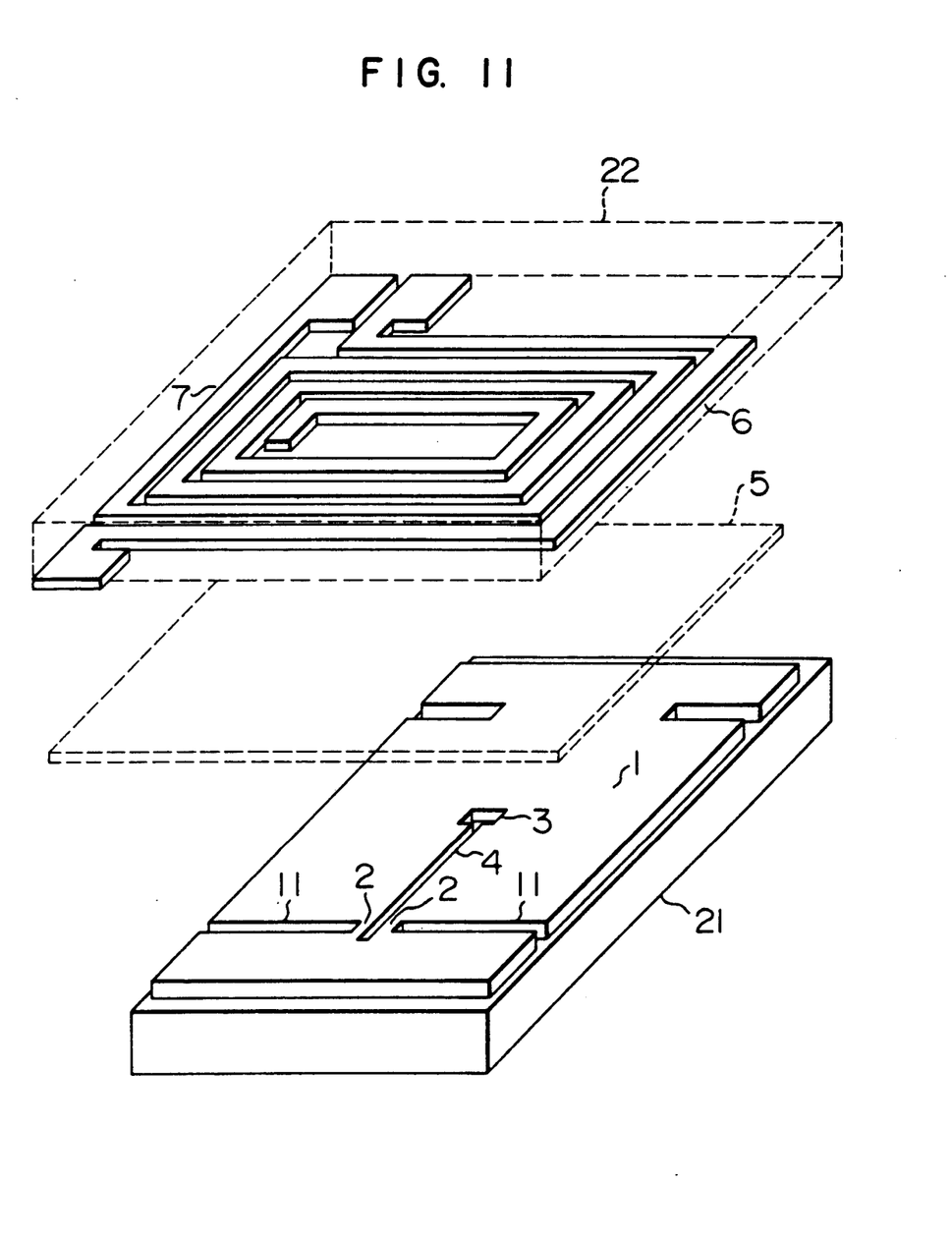
FIG. 11 is a scheme of a SQUID, in which 2 substrates are used, in still another embodiment of the present invention.

FIG. 11 is a scheme of still another embodiment in which a SQUID is constructed by using two substrates, each of which is provided with a high temperature superconductor layer. An aperture portion 3 and a slit 4 are formed by processing a high temperature superconductor layer 1 disposed on the substrate 21. On the other hand another high temperature superconductor layer is formed on the other substrate and a modulation coil 6 and an input coil are formed by processing it. These two substrates are closely stuck through an interlayer insulating layer to form a SQUID. The interlayer insulating layer 5 may be formed on either one of the substrates. In this way an effect can be obtained that the SQUID using high temperature superconductor layers is constructed in a simple manner.

The Josephson junction used in the above embodiments may be a bridge type junction, in which the stripe width or the layer thickness of the superconductor layers is small, a sandwich type junction or a proximity effect type junction.

According to the present invention it is possible to realize a SQUID of excellent characteristics by setting the SQUID inductance at the optimum value to set the signal voltage value at a level sufficiently higher than the thermal noise level in a SQUID using a high temperature superconductor. According to the present invention the SQUID can be operated at the liquid nitrogen temperature and therefore very weak magnetic field measurement such as living body magnetism measurement, etc. is facilitated.

What is claimed is:

1. A superconducting quantum interference device (SQUID) for use in a high temperature semiconductor environment cooled with liquid nitrogen, comprising:
   a substrate;
   a first high temperature superconductor layer disposed on said substrate, comprising:
      an aperture producing a superconducting inductance around said aperture;
      a first slit extending from said aperture;
      two second slits, each of said second slits extending from a circumference of said first high temperature superconductor layer to a neighborhood near each side of said first slit;
   two regions each disposed between said first slit and one of said two second slits, respectively, for constricting current paths flowing along said first slit to shorten substantial current paths contributing to said superconducting inductance;
   two Josephson junctions each disposed in one of said two regions;
   a first interlayer insulating layer formed on said first high temperature superconductor layer; and
   a modulation coil and an input coil comprising a second high temperature superconductor layer disposed on said first interlayer insulating layer;
   wherein a value of said superconducting inductance of said superconducting quantum interference device (SQUID) is in a range between 10 and 40 pH.

2. A superconducting quantum interference device (SQUID) according to claim 1, wherein the value of the superconducting inductance of said superconducting quantum interference device (SQUID) is chosen in range between 13 and 30 pH.

3. A superconducting quantum interference device (SQUID) according to claim 1, wherein one of said apertures is a quadratic aperture and the length of one side of said one aperture is chosen in a range between 6.4 μm and 25.5 μm.

4. A superconducting quantum interference device (SQUID) according to claim 1, wherein stray capacitance is reduced by reducing the area of the part in the neighborhood of an electrode, which is opposite to said Josephson junctions.

5. A superconducting quantum interference device (SQUID) according to claim 1 wherein connection electrodes and said first high temperature superconductor layer for superconducting inductance are formed on the same plane.

6. A superconducting quantum interference device (SQUID) according to claim 1, further comprising a second substrate, said first high temperature superconductor layer for superconducting inductance having an aperture and a slit being formed on one of said substrates and said second high temperature superconductor layer being disposed on the other substrate, said modulation coil and said input coil being formed therefrom, said two substrates being held closely together through said interlayer insulating layer put therebetween.

7. A superconducting quantum interference device (SQUID) according to claim 1, wherein said high temperature superconductor layers are made of a mixture of some of oxides of potassium K, calcium Ca, cesium Cs, scandium Sc, strontium Sr, yttrium Y, rare earth elements, Barium Ba, copper Cu, thallium Tl, lead Pb, and bismuth Bi.

8. A superconducting quantum interference device (SQUID) according to claim 1, wherein said high temperature superconductor layers include high temperature superconductor thin films.

9. A superconducting quantum interference device (SQUID) according to claim 8, wherein thickness of said thin film is less than 10 μm.

10. The superconducting quantum interference device (SQUID) of claim 1 further comprising
a ground plane disposed on said substrate and beneath said first high temperature superconductor layer, said ground plane comprising a third high temperature superconductor layer; and
a second interlayer insulating layer disposed on said third high temperature superconductor layer between said first and said third high temperature superconductor layers.

11. The superconducting quantum interference device (SQUID) according to claim 1,
wherein said two Josephson junctions are disposed at a region distant from a region substantially influenced by a magnetic field generated by said input coil.

12. A superconductor quantum interference device (SQUID) for use in a high temperature semiconductor environment cooled with liquid nitrogen, comprising:
a substrate;
a first high temperature superconductor layer disposed on said substrate, comprising:
two apertures producing superconducting inductances around each of said apertures;
two first slits extending rom each of said apertures;
two second slits, each of said second slits extending from a circumference of said first high temperature superconductor layer to a neighborhood near one side of each of said first slits;
two regions disposed between each of said first slits and each of said second slits for constricting current paths flowing along said first slit to shorten substantial current paths contributing to said superconducting inductances;
two Josephson junctions each disposed in one of said two regions, said superconducting inductances being electrically connected in parallel to each other;
a first interlayer insulting layer formed on said first high temperature superconductor layer; and
a modulation coil and an input coil comprising a second high temperature superconductor layer; and
a modulation coil and an input coil comprising a second high temperature superconductor layer disposed on said first interlayer insulating layer;
wherein a value of said superconducting inductance of said superconducting quantum interference device (SQUID) is in a range between 10 and 40 pH.

13. The superconducting quantum interference device (SQUID) according to claim 12,
wherein said two Josephson junctions are disposed at a region distant from a region substantially influenced by a magnetic field generated by said input coil.

14. A superconducting quantum interference device (SQUID) according to claim 12, wherein the superconducting inductance is S-shaped.

15. The superconducting quantum interference device of claim 12, wherein said first high temperature superconductor layer includes a superconductor thin film comprising an S-shaped superconductor thin film formed around said apertures.

16. The superconducting quantum interference device of claim 15, wherein a thickness of said superconductor thin film is less than 10 mm.

17. The superconducting quantum interference device of claim 12, wherein the value of the superconducting inductance of said superconducting quantum interference device is in a range between 13 and 30 pH.

* * * * *

UNITED STATES PATENT AND TRADEMARK OFFICE
CERTIFICATE OF CORRECTION

PATENT NO. : 5,218,297
DATED : 8 June 1993
INVENTOR(S) : Hideaki NAKANE et al.

It is certified that error appears in the above-indentified patent and that said Letters Patent is hereby corrected as shown below:

| Column | Line | |
|---|---|---|
| 3 | 35 | Change "BRIEF DESCRIPTION DRAWINGS" to --BRIEF DESCRIPTION OF THE DRAWINGS--. |
| 5 | 2 | Change "$Bi_a Sr_b Ca_c Cu_c O_x$" to --$Bi_a Sr_b Ca_c Cu_d O_x$--. |

Signed and Sealed this

Twenty-ninth Day of March, 1994

Attest:

BRUCE LEHMAN

Attesting Officer
Commissioner of Patents and Trademarks